(12) United States Patent
Yasutake

(10) Patent No.: US 10,217,689 B2
(45) Date of Patent: Feb. 26, 2019

(54) SEMICONDUCTOR INTEGRATED CIRCUIT DEVICE AND METHOD FOR MANUFACTURING THE SAME

(71) Applicant: ROHM CO., LTD., Ukyo-Ku, Kyoto (JP)

(72) Inventor: Ippei Yasutake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/404,740

(22) Filed: Jan. 12, 2017

(65) Prior Publication Data

US 2017/0207140 A1    Jul. 20, 2017

(30) Foreign Application Priority Data

Jan. 20, 2016    (JP) ................................. 2016-008608

(51) Int. Cl.
*H01L 23/367*    (2006.01)
*H01L 21/48*    (2006.01)
*H01L 23/495*    (2006.01)
*H01L 23/498*    (2006.01)
*H01L 23/00*    (2006.01)

(52) U.S. Cl.
CPC ........ *H01L 23/3677* (2013.01); *H01L 21/486* (2013.01); *H01L 21/4853* (2013.01); *H01L 21/4882* (2013.01); *H01L 23/49541* (2013.01); *H01L 23/49827* (2013.01); *H01L 24/32* (2013.01); *H01L 2224/32235* (2013.01)

(58) Field of Classification Search
CPC .................................................. H01L 23/3677
USPC ........................................................ 257/713
See application file for complete search history.

(56) References Cited

U.S. PATENT DOCUMENTS

| | | | |
|---|---|---|---|
| 6,566,165 B1 * | 5/2003 | Otani | H01L 23/49838 438/106 |
| 8,045,364 B2 * | 10/2011 | Schloss | G11C 13/0007 365/148 |
| 2005/0230147 A1 * | 10/2005 | Momokawa | H05K 3/306 174/256 |
| 2007/0145553 A1 * | 6/2007 | Araki | H01L 23/3171 257/678 |
| 2009/0231910 A1 * | 9/2009 | Liu | H01L 27/2463 365/163 |

FOREIGN PATENT DOCUMENTS

JP    2014140002 A    7/2014
JP    2015018857 A    1/2015

* cited by examiner

*Primary Examiner* — Jami Valentine Miller
(74) *Attorney, Agent, or Firm* — Cantor Colburn LLP

(57) ABSTRACT

A semiconductor integrated circuit device includes: an insulating substrate; a via which penetrates through the insulating substrate; a first metal layer disposed on a front surface of the insulating substrate; a first resist layer disposed on the first metal layer in the vicinity of the via; a solder layer disposed on the first metal layer, the via and the first resist layer; a gap region formed between the solder layer and the first resist layer, and a semiconductor integrated circuit disposed on the solder layer.

12 Claims, 17 Drawing Sheets

SEMICONDUCTOR INTEGRATED CIRCUIT DEVICE AND METHOD FOR MANUFACTURING THE SAME

CROSS-REFERENCE TO RELATED APPLICATION

This application is based upon and claims the benefit of priority from Japanese Patent Application No. 2016-008608, filed on Jan. 20, 2016, the entire contents of which are incorporated herein by reference.

TECHNICAL FIELD

The present disclosure relates to a semiconductor integrated circuit device and a method for manufacturing the same.

BACKGROUND

In a semiconductor device or a semiconductor integrated circuit, the importance of heat dissipation design is increasing due to high density packaging on a mounting substrate.

Since a surface area of a miniaturized semiconductor device is small, heat dissipation from the surface of the semiconductor device cannot be expected and heat dissipation from the substrate is predominant. In addition, heat dissipation performance in the lateral direction of the substrate is restricted by thinning of copper to suppress the substrate cost. Thus, the existence of a through-hole or a via which realizes a heat dissipation path in the vertical direction affects the heat dissipation performance.

SUMMARY

The present disclosure provides some embodiments of a semiconductor integrated circuit device with improved heat dissipation performance, and a method for manufacturing the same.

According to one embodiment of the present disclosure, there is provided a semiconductor integrated circuit device including: an insulating substrate; a via which penetrates through the insulating substrate; a first metal layer disposed on a front surface of the insulating substrate; a first resist layer disposed on the first metal layer in the vicinity of the via; a solder layer disposed on the first metal layer, the via and the first resist layer, a gap region formed between the solder layer and the first resist layer; and a semiconductor integrated circuit disposed on the solder layer.

According to another embodiment of the present disclosure, there is provided a method for manufacturing a semiconductor integrated circuit device, including: preparing an insulating substrate and forming a via in the insulating substrate; forming a first metal layer on a front surface of the insulating substrate, forming a second metal layer on a rear surface of the insulating substrate, and forming a third metal layer on an inner wall side surface of the via; forming a resist on the first metal layer, on the second metal layer, and in the via so as to fill the via with the resist; forming a first resist layer on the first metal layer in the vicinity of the via by patterning the resist; forming a solder layer on the first metal layer, the first resist layer and the via; mounting a semiconductor integrated circuit on the solder layer; and performing a reflow process to form a gap region between the solder layer and the first resist layer while fusing the solder layer and the first metal layer.

DETAILED DESCRIPTION

Figure 1:
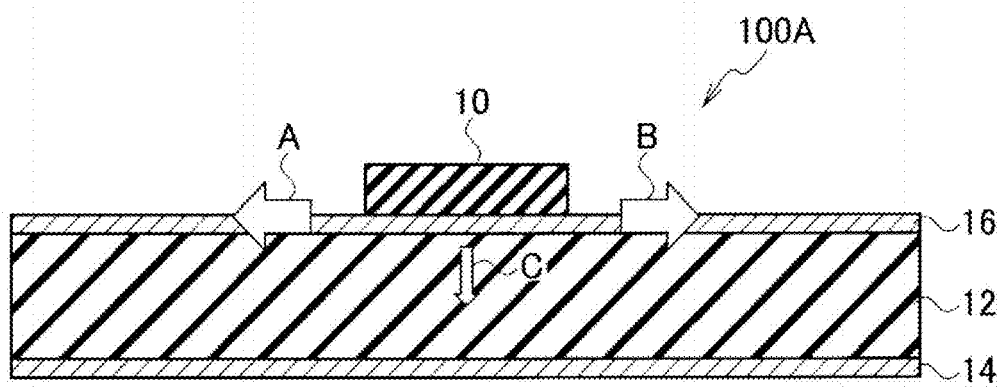
FIG. 1 is a schematic sectional structural view for explaining heat dissipation performance of a semiconductor integrated circuit device according to Comparative Example 1 in a case where no via is present.

Embodiments of the present disclosure will now be described in detail with reference to the drawings. Throughout the drawings, the same or similar elements are denoted by the same or similar reference numerals. It is however noted that the drawings are just schematic and relationships between thickness and planar dimension of elements, thickness ratios of various layers and so on may be unrealistic. Accordingly, detailed thickness and dimensions should be determined in consideration of the following description. In addition, it is to be understood that the figures include different dimensional relationships and ratios.

The following embodiments are provided to illustrate devices and methods to embody the technical ideas of the present disclosure and are not limited to materials, forms, structures, arrangements and so on of elements detailed herein. The embodiments of the present disclosure may be modified in different ways without departing from the spirit and scope of the invention defined in the claims.

COMPARATIVE EXAMPLES

Comparative Example 1

FIG. 1 shows a schematic sectional structure for explaining heat dissipation performance of a semiconductor integrated circuit device 100A according to Comparative Example 1. The semiconductor integrated circuit device 100A according to Comparative Example 1 corresponds to a case where no via is present.

As shown in FIG. 1, the semiconductor integrated circuit device 100A according to Comparative Example 1 includes an insulating substrate 12, a metal layer 16 disposed on the insulating substrate 12, and a semiconductor integrated circuit 10 disposed on the metal layer 16. A metal layer 14 is disposed on the rear surface of the insulating substrate 12.

A substrate structure including the insulating substrate 12, the metal layer 16 disposed on the front surface of the insulating substrate 12, and the metal layer 14 disposed on the rear surface of the insulating substrate 12 may be formed, for example, by a circuit board structure composed of a joined body including a copper foil layer, an epoxy resin layer and a copper foil layer. For example, a printed circuit board (PCB) such as CEM3, FR4, FR5 or the like may be applied as the circuit board structure composed of a joined body including a copper foil layer, an epoxy resin layer and a copper foil layer. Alternatively, the substrate structure may be formed by a circuit board composed of a joined body including a metal layer, a ceramic substrate and a metal layer, or an insulating substrate (circuit board) such as a DBC (Direct Bonding Copper) substrate, a DBA (Direct Brazed Aluminum) substrate, an AMB (Active Metal Brazed or Active Metal Bond) substrate.

In the semiconductor integrated circuit device 100A according to Comparative Example 1, heat dissipation which conducts through the metal layer 16 in the horizontal direction parallel to the insulating substrate 12 is predominant as schematically indicated by heat dissipation paths A and B in FIG. 1, whereas heat dissipation in the vertical direction perpendicular to the insulating substrate 12 is relatively minute as schematically indicated by a heat dissipation path C in FIG. 1.

Comparative Example 2

Figure 2:
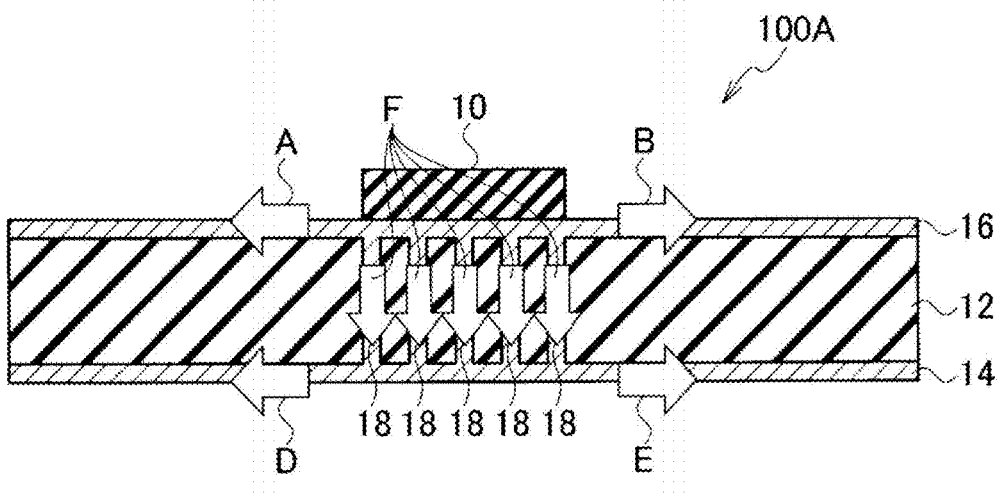
FIG. 2 is a schematic sectional structural view for explaining heat dissipation performance of a semiconductor integrated circuit device according to Comparative Example 2 in a case where a via is present.

FIG. 2 shows a schematic sectional structure for explaining heat dissipation performance of a semiconductor integrated circuit device 100A according to Comparative Example 2. The semiconductor integrated circuit device according to Comparative Example 2 corresponds to a case where a via is present.

As shown in FIG. 2, the semiconductor integrated circuit device 100A according to Comparative Example 2 includes an insulating substrate 12, a metal layer 16 disposed on the insulating substrate 12, and a semiconductor integrated circuit 10 disposed on the metal layer 16. A metal layer 14 is disposed on the rear surface of the insulating substrate 12.

As shown in FIG. 2, the insulating substrate 12 has a via 18 filled with metal. A plurality of vias 18 may be arranged as shown in FIG. 2. As shown in FIG. 2, the plurality of vias 18 penetrates through the insulating substrate 12 to connect between the metal layer 16 and the metal layer 14.

In the semiconductor integrated circuit device 100A according to Comparative Example 2, as well as heat dissipation which conducts through the metal layer 16 in the horizontal direction parallel to the insulating substrate 12, as schematically indicated by heat dissipation paths A and B in FIG. 2, heat dissipation which conducts through the metal layer 14 in the horizontal direction parallel to the insulating substrate 12, as schematically indicated by heat dissipation paths D and E in FIG. 2, is also added by thermal conduction through the vias 18 filled with metal, as schematically indicated by a heat dissipation path F in FIG. 2. Therefore, the heat dissipation performance is improved over the structure of Comparative Example 1.

Since the surface area of a miniaturized semiconductor device is small, heat dissipation from the surface of the semiconductor device cannot be expected and heat dissipation from the substrate is predominant. In addition, the heat dissipation performance in the lateral direction of the insulating substrate 12 is restricted by thinning of the metal layer 16 to suppress the substrate cost. Therefore, the existence of the vias 18 which realize a heat dissipation path in the vertical direction affects the overall heat dissipation performance of the substrate.

Comparative Example 3

Figure 3:
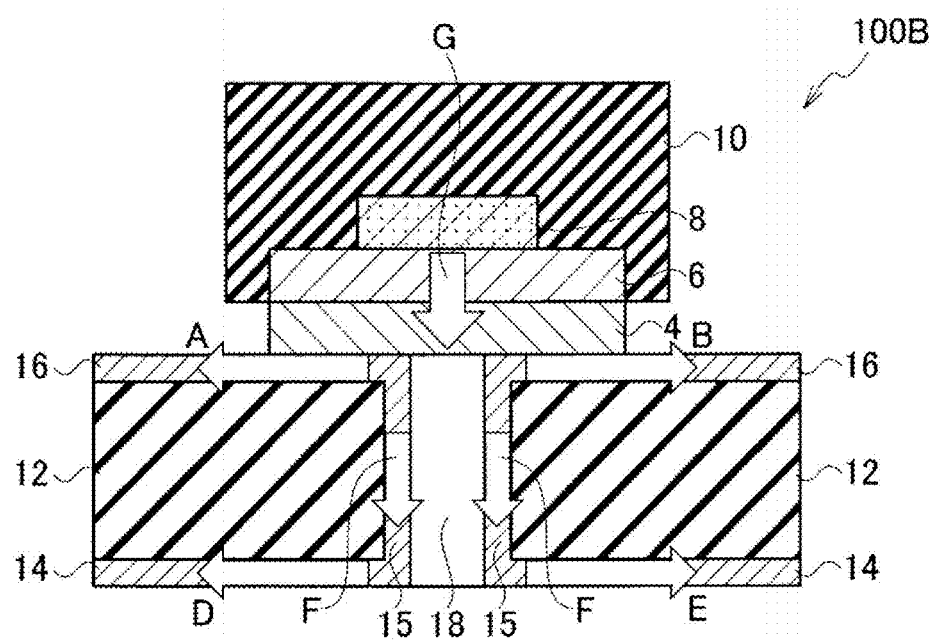
FIG. 3 is a schematic sectional structural view for explaining heat dissipation performance of a semiconductor integrated circuit device according to Comparative Example 3 in a case where a via is present.

FIG. 3 shows a schematic sectional structure for explaining heat dissipation performance of a semiconductor integrated circuit device 100B according to Comparative Example 3. The semiconductor integrated circuit device 100B according to Comparative Example 3 corresponds to a case where a via 18 is present.

As shown in FIG. 3, the semiconductor integrated circuit device 100B according to Comparative Example 3 includes an insulating substrate 12, a metal layer 16 disposed on the insulating substrate 12, and a semiconductor integrated circuit 10 disposed on the metal layer 16. A metal layer 14 is disposed on the rear surface of the insulating substrate 12.

As shown in FIG. 3, the insulating substrate 12 has a via 18 with a metal layer 15 disposed on an inner wall side surface of the via 18. A plurality of vias 18 may be arranged. In addition, the via 18 penetrates through the insulating substrate 12, as shown in FIG. 3, and the metal layer 15 connects between the metal layer 16 and the metal layer 14.

The semiconductor integrated circuit 10 includes an island 6 and a semiconductor integrated circuit chip 8 disposed on the island 6. The island 6 is connected to the metal layer 16 through a solder layer 4.

In the semiconductor integrated circuit device 100B according to Comparative Example 3, ideally, heat generated from the semiconductor integrated circuit chip 8 conducts to the solder layer 4 via the island 6, as schematically indicated by a heat dissipation path G in FIG. 3. Further, as well as heat dissipation which conducts through the metal layer 16 in the horizontal direction parallel to the insulating substrate 12, as schematically indicated by heat dissipation paths A and B in FIG. 3, heat dissipation which conducts through the metal layer 14 in the horizontal direction parallel to the insulating substrate 12, as schematically indicated by heat dissipation paths D and E in FIG. 3, is also added by thermal conduction through the via 18 with the metal layer 15 disposed therein, as schematically indicated by a heat dissipation path F in FIG. 3.

However, the semiconductor integrated circuit device 100B according to Comparative Example 3 is an ideal structure example. If the via 18 is disposed immediately below the solder layer 4, solder suction occurs, the heat dissipation performance is deteriorated due to decrease of a solder fusion rate, and electric short-circuit occurs due to a solder flow to the rear surface of the substrate.

Comparative Example 4

Figure 4:
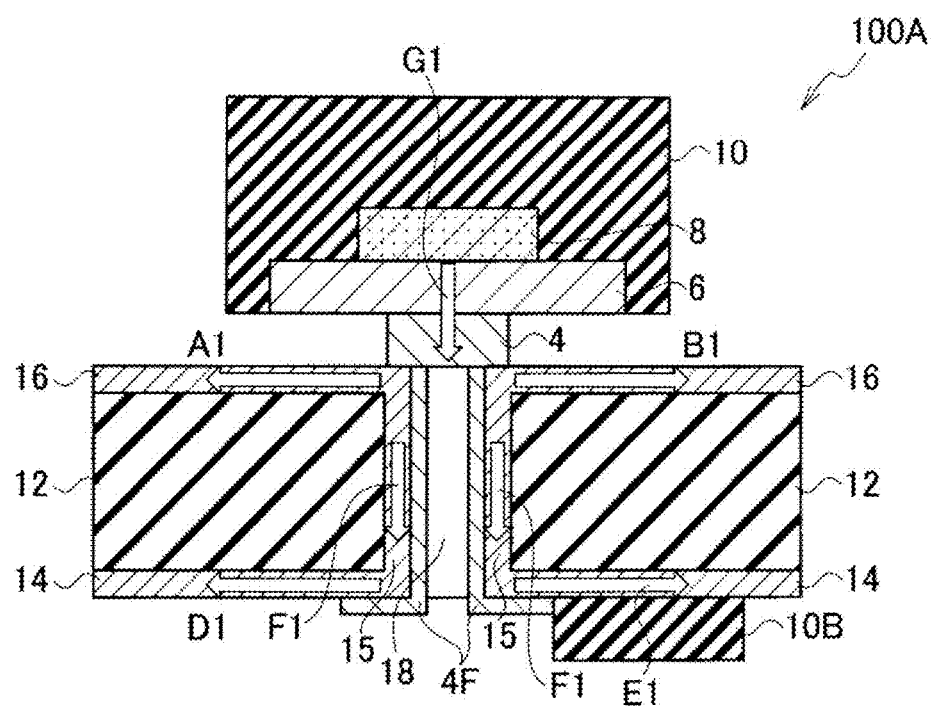
FIG. 4 is a schematic sectional structural view for explaining heat dissipation performance of a semiconductor integrated circuit device according to Comparative Example 4 in a case where a via is present.

FIG. 4 shows a schematic sectional structure for explaining heat dissipation performance of a semiconductor integrated circuit device 100A according to Comparative Example 4. The semiconductor integrated circuit device 100A according to Comparative Example 4 corresponds to a case where a via 18 is present.

As shown in FIG. 4, the semiconductor integrated circuit device 100A according to Comparative Example 4 includes an insulating substrate 12, a metal layer 16 disposed on the insulating substrate 12, and a semiconductor integrated circuit 10 disposed on the metal layer 16. A metal layer 14 is disposed on the rear surface of the insulating substrate 12.

As shown in FIG. 4, the insulating substrate 12 has a via 18 with a metal layer 15 disposed on an inner wall side surface of the via 18. A plurality of vias 18 may be present. The via 18 illustrated in FIG. 4 penetrates through the insulating substrate 12, and the metal layer 15 connects between the metal layer 16 and the metal layer 14.

The semiconductor integrated circuit 10 includes an island 6 and a semiconductor integrated circuit chip 8 disposed on the island 6. The island 6 is connected to the metal layer 16 through a solder layer 4.

In the semiconductor integrated circuit device 100A according to Comparative Example 4, heat generated from the semiconductor integrated circuit chip 8 conducts to the solder layer 4 via the island 6, as schematically indicated by a heat dissipation path G1 in FIG. 4. Further, as well as heat dissipation which conducts through the metal layer 16 in the horizontal direction parallel to the insulating substrate 12, as schematically indicated by heat dissipation paths A1 and B1 in FIG. 4, heat dissipation which conducts through the metal layer 14 in the horizontal direction parallel to the insulating substrate 12, as schematically indicated by heat dissipation paths D1 and E1 in FIG. 4, is also added by thermal conduction through the via 18 with the metal layer 15 disposed therein, as schematically indicated by a heat dissipation path F1 in FIG. 4.

However, in the semiconductor integrated circuit device 100A according to Comparative Example 4, since the via 18 is disposed immediately below the solder layer 4, solder suction occurs in the solder layer 4, the heat dissipation performance deteriorates due to a decrease in the solder fusion rate between the solder layer 4 and the island 6 or between the solder layer 4 and the metal layer 16, and an electric short-circuit with another semiconductor integrated circuit 10B by a solder layer 4F occurs due to a solder flow of the solder layer 4 to the rear surface of the insulating substrate 12.

Comparative Example 5

Figure 5:
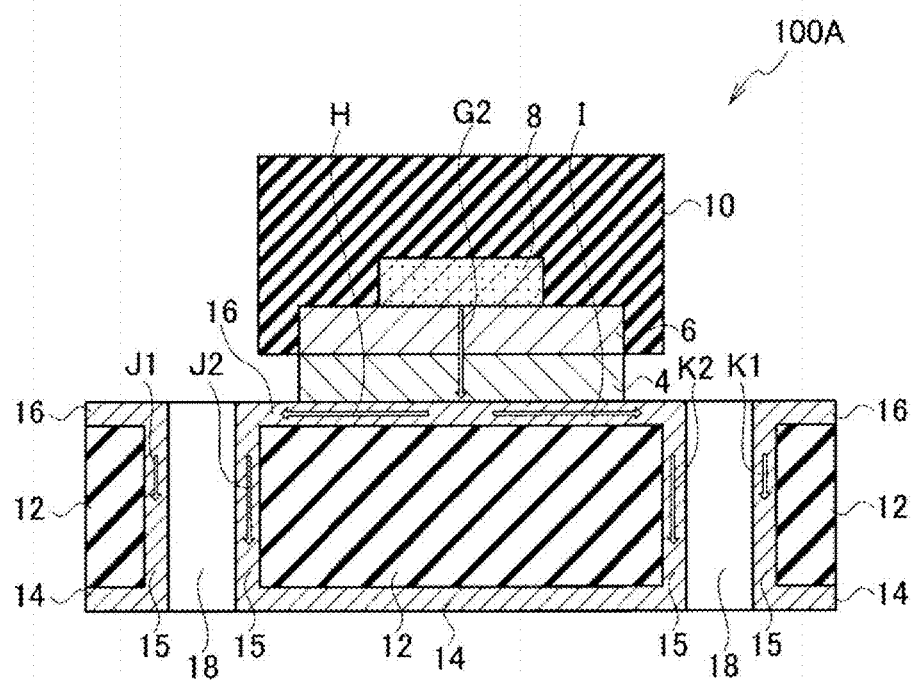
FIG. 5 is a schematic sectional structural view for explaining heat dissipation performance of a semiconductor integrated circuit device according to Comparative Example 5 in a case where a via is present.

FIG. 5 shows a schematic sectional structure for explaining heat dissipation performance of a semiconductor integrated circuit device 100A according to Comparative Example 5. The semiconductor integrated circuit device 100A according to Comparative Example 5 corresponds to a case where a via 18 is present. In addition, as shown in FIG. 5, in order to prevent solder suction from occurring in the solder layer 4, the via 18 is not disposed immediately below the solder layer 4 but is disposed in a peripheral portion of the solder layer 4.

As shown in FIG. 5, the semiconductor integrated circuit device 100A according to Comparative Example 5 includes an insulating substrate 12, a metal layer 16 disposed on the insulating substrate 12, and a semiconductor integrated circuit 10 disposed on the metal layer 16. A metal layer 14 is disposed on the rear surface of the insulating substrate 12.

As shown in FIG. 5, the insulating substrate 12 has vias 18 with metal layers 15 disposed respectively on inner wall side surfaces of the vias 18. In addition, the vias 18 penetrate through the insulating substrate 12, as shown in FIG. 5, and the metal layers 15 connect between the metal layer 16 and the metal layer 14.

The semiconductor integrated circuit 10 includes an island 6 and a semiconductor integrated circuit chip 8 disposed on the island 6. The island 6 is connected to the metal layer 16 through a solder layer 4.

In the semiconductor integrated circuit device 100A according to Comparative Example 5, heat generated from the semiconductor integrated circuit chip 8 conducts to the solder layer 4 via the island 6, as schematically indicated by a heat dissipation path G2 in FIG. 5. Further, as well as heat dissipation which conducts through the metal layer 16 in the horizontal direction parallel to the insulating substrate 12, as schematically indicated by heat dissipation paths H and I in FIG. 5, heat dissipation conducts through the metal layer 14 by thermal conduction through the vias 18 with the metal layer 15 disposed therein, as schematically indicated by heat dissipation paths J1, J2, K1 and K2 in FIG. 5.

However, since the vias 18 cannot be disposed directly on a solder joint and are disposed in a state where they lead outside of the joint, an unnecessary path leading laterally from the chip as a heat source is added, which results in deterioration of heat dissipation performance and increase in temperature.

In a semiconductor package with ExposedPAD and Fin (for example, HTQFP (Thin Quad Flat Package with Heat sink), QFN (Quad Flat Non-leaded package), etc.), although the semiconductor package is soldered to an island and heat dissipation to a substrate side becomes a main heat dissipation path, there is a large variation in heat dissipation performance depending on the presence of a via directly below an ExposedPAD or Fin. However, if a via is placed immediately below an ExposedPAD or Fin, solder suction occurs, the heat dissipation performance deteriorates due to a decrease in solder fusion rate, and an electric short-circuit occurs due to solder flow to the rear surface of the substrate. Therefore, a via cannot be disposed directly on a solder joint and it is necessary to dispose a via in a state where it leads outside of the joint. Then, an unnecessary path leading laterally from the chip as a heat source should be added, which results in deterioration of heat dissipation performance and increase in temperature.

[First Embodiment]

Figure 6:
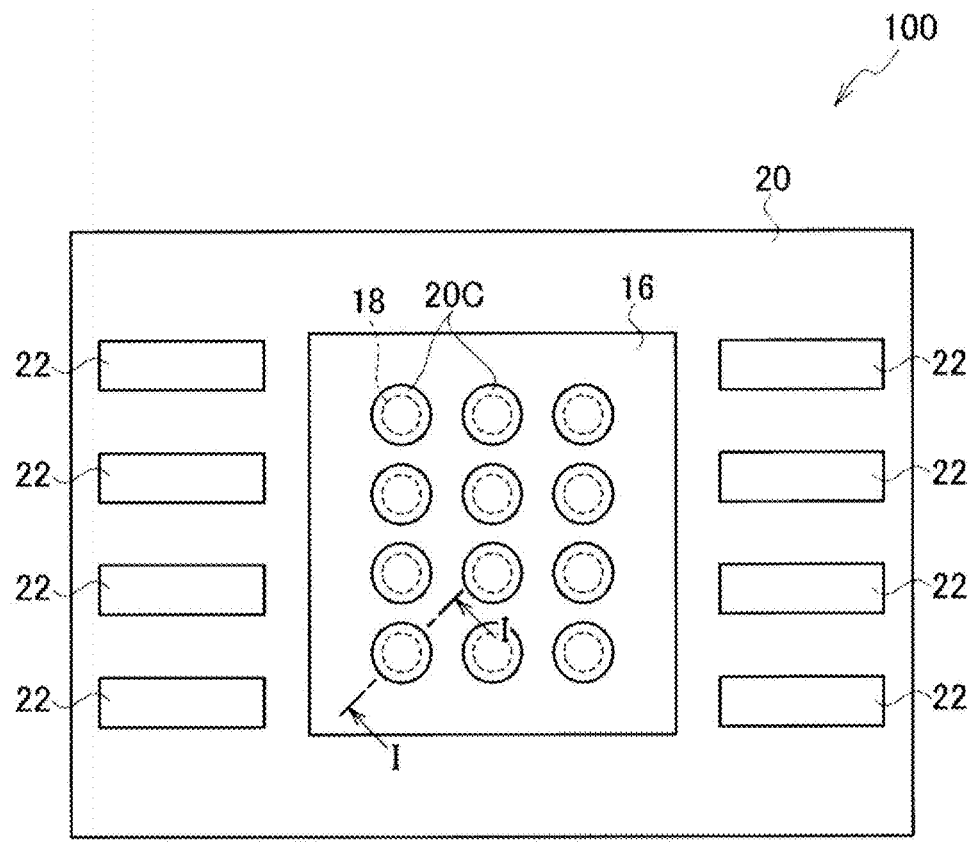
FIG. 6 is a schematic plane pattern structural view before solder layer formation in a semiconductor integrated circuit device according to a first embodiment.

FIG. 6 illustrates an example of a schematic plane pattern structure before formation of a solder layer 24 in a semiconductor integrated circuit device 100 according to a first embodiment. The plane pattern structure of FIG. 6 corresponds to a mounting substrate on which a semiconductor integrated circuit 10 is mounted.

Figure 7A:
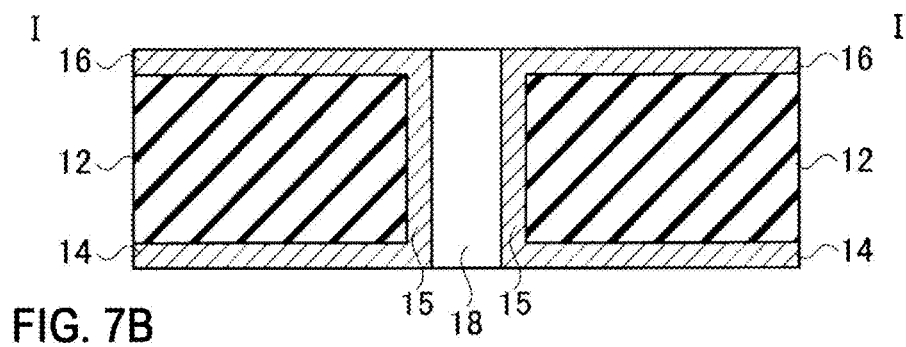
FIG. 7A is a schematic sectional structural view (first view) for explaining a step of a method for manufacturing the semiconductor integrated circuit device according to the first embodiment.
Figure 7B:
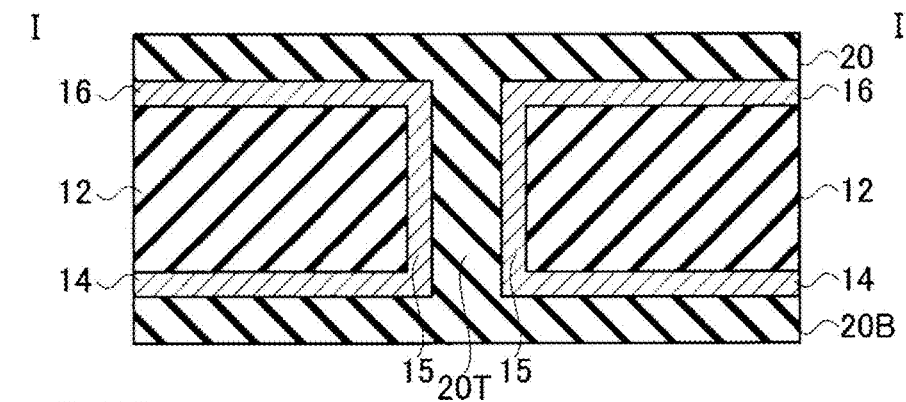
FIG. 7B is a schematic sectional structural view (second view) for explaining a step of the method for manufacturing the semiconductor integrated circuit device according to the first embodiment.
Figure 7C:
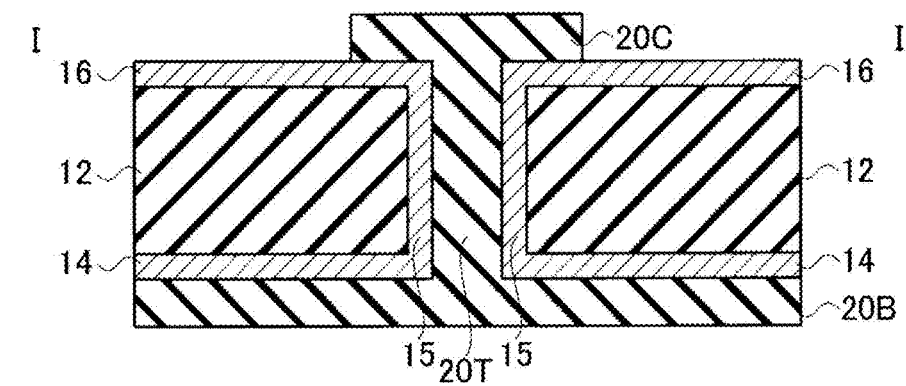
FIG. 7C is a schematic sectional structural view (third view) for explaining a step of the method for manufacturing the semiconductor integrated circuit device according to the first embodiment.

FIG. 7A illustrates a schematic sectional structure (first view) for explaining a step of a method for manufacturing the semiconductor integrated circuit device according to the first embodiment. FIG. 7B illustrates a schematic sectional structure (second view) for explaining a step of the method for manufacturing the semiconductor integrated circuit device according to the first embodiment. FIG. 7C illustrates a schematic sectional structure (third view) for explaining a step of the method for manufacturing the semiconductor integrated circuit device according to the first embodiment. The schematic sectional structures illustrated in FIGS. 7A to 7C correspond to a schematic sectional structure taken along line I-I in FIG. 6. That is, the schematic sectional structures illustrated in FIGS. 7A to 7C correspond to a schematic sectional structure in the vicinity of one via 18.

Figure 8A:
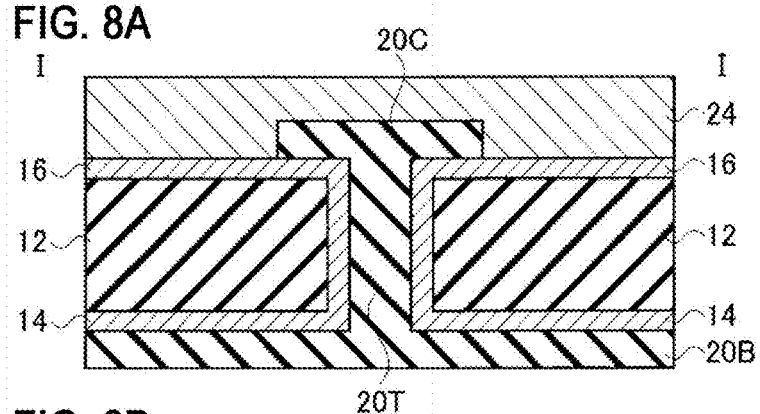
FIG. 8A is a schematic sectional structural view (fourth view) for explaining a step of the method for manufacturing the semiconductor integrated circuit device according to the first embodiment.
Figure 8B:
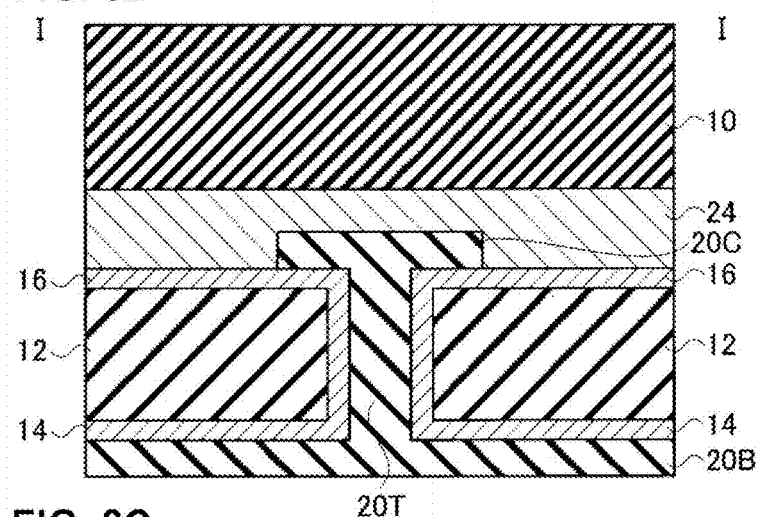
FIG. 8B is a schematic sectional structural view (fifth view) for explaining a step of the method for manufacturing the semiconductor integrated circuit device according to the first embodiment.
Figure 8C:
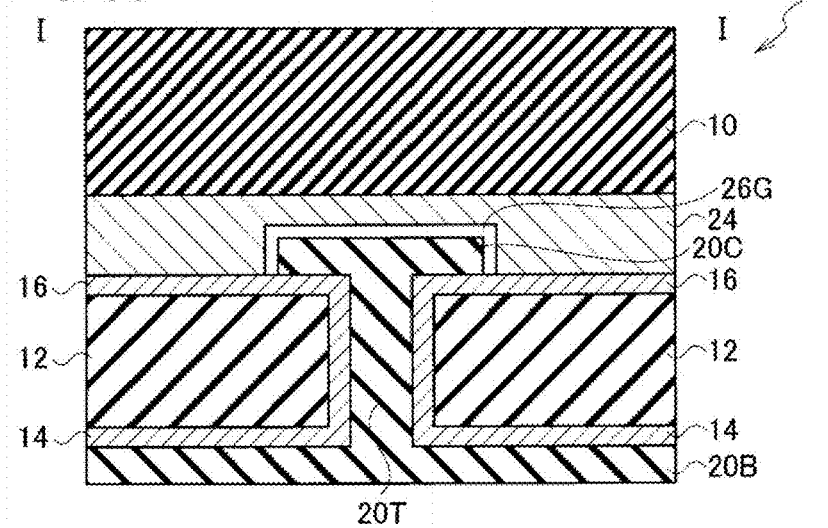
FIG. 8C is a schematic sectional structural view (sixth view) for explaining a step of the method for manufacturing the semiconductor integrated circuit device according to the first embodiment.

In addition, FIG. 8A illustrates a schematic sectional structure (fourth view) for explaining a step of the method for manufacturing the semiconductor integrated circuit device according to the first embodiment. FIG. 8B illustrates a schematic sectional structure (fifth view) for explaining a step of the method for manufacturing the semiconductor integrated circuit device according to the first embodiment. FIG. 8C illustrates a schematic sectional structure (sixth view) for explaining a step of the method for manufacturing the semiconductor integrated circuit device according to the first embodiment. Similarly, the schematic sectional structures illustrated in FIGS. 8A to 8C correspond to a schematic sectional structure taken along line I-I in FIG. 6. That is, the schematic sectional structures illustrated in FIGS. 8A to 8C correspond to a schematic sectional structure in the vicinity of one via 18.

Here, as shown in FIG. 7A, the mounting substrate includes an insulating substrate 12, a metal layer 16 disposed on the insulating substrate 12, and a metal layer 14 disposed on the rear surface of the insulating substrate 12.

A substrate structure including the insulating substrate 12, the metal layer 16 disposed on the front surface of the insulating substrate 12, and the metal layer 14 disposed on the rear surface of the insulating substrate 12 may be formed, for example, by a circuit board structure composed of a joined body including a copper foil layer, an epoxy resin layer and a copper foil layer. For example, a PCB such as CEM3, FR4, FR5 or the like may be applied as the circuit board structure composed of a joined body including a copper foil layer, an epoxy resin layer and a copper foil layer. Alternatively, the substrate structure may be formed by a circuit board composed of a joined body including a metal layer, a ceramic substrate and a metal layer, or an insulating substrate (circuit board) such as a DBC substrate, a DBA substrate, or an AMB substrate.

As shown in FIG. 7A, the insulating substrate 12 has a via 18 with a metal layer 15 disposed on an inner wall side surface of the via 18. A plurality of vias 18 may be present. The via 18, as shown in FIG. 7A, penetrates through the insulating substrate 12, and the metal layer 15 connects between the metal layer 16 and the metal layer 14.

Figure 9:
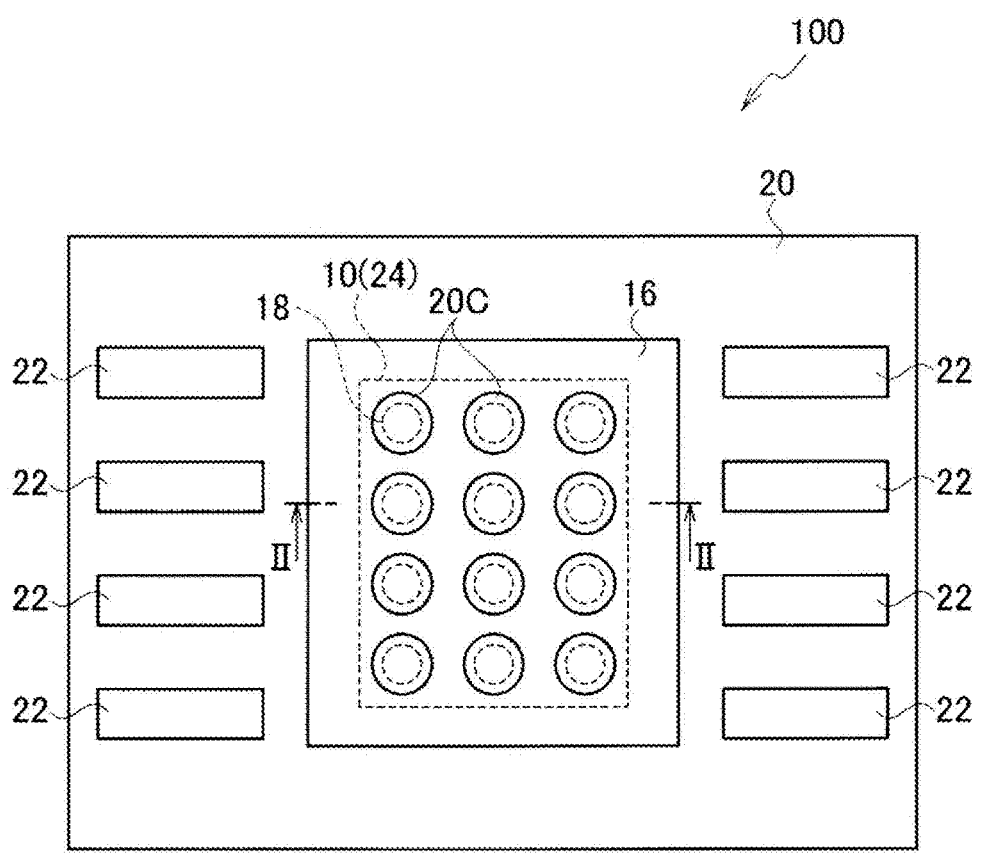
FIG. 9 is a schematic plane pattern structural view after a semiconductor integrated circuit is mounted through a solder layer and a reflow process is performed in the semiconductor integrated circuit device according to the first embodiment.

FIG. 9 illustrates a schematic plane pattern structure after a semiconductor integrated circuit 10 is mounted on the metal layer 16 through a solder layer 24 and a reflow process is performed in the semiconductor integrated circuit device 100 according to the first embodiment. In addition, FIG. 10 illustrates a schematic sectional structure of the semiconductor integrated circuit device 100 according to the first embodiment, which is taken along line II-II in FIG. 9.

Figure 10:
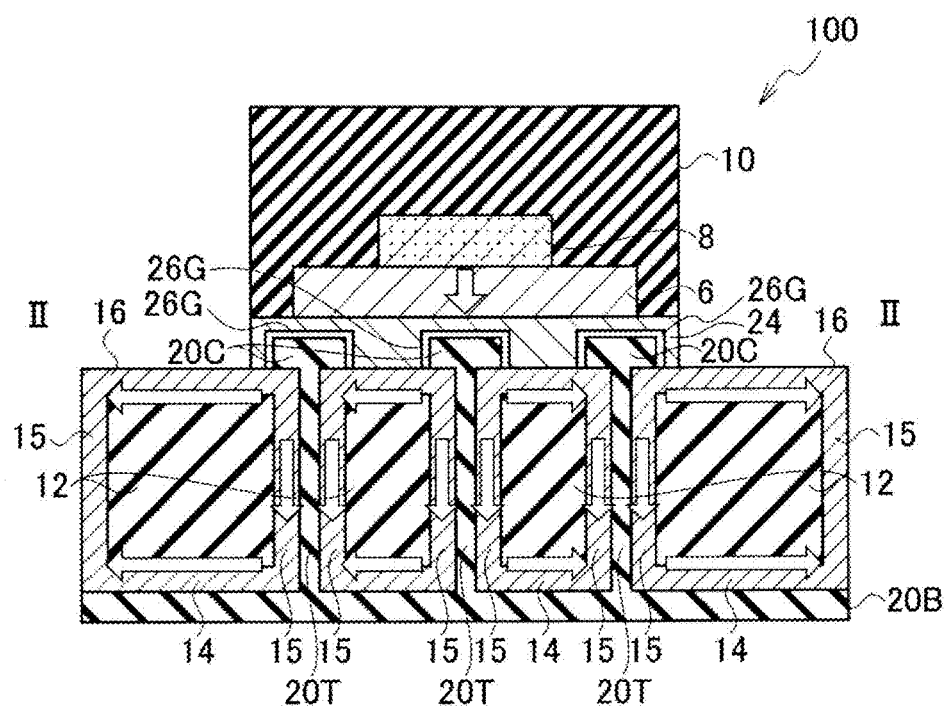
FIG. 10 is a schematic sectional structural view of the semiconductor integrated circuit device according to the first embodiment, which is taken along line II-II in FIG. 9.

As shown in FIGS. 8C and 10, the semiconductor integrated circuit device 100 according to the first embodiment includes an insulating substrate 12, a via 18 penetrating through the insulating substrate 12, a metal layer 16 disposed on the insulating substrate 12, a resist layer 20C disposed on the metal layer 16 in the vicinity of the via 18, a solder layer 24 disposed on the metal layer 16, the via 18 and the resist layer 20C, a gap region 26G formed between the solder layer 24 and the resist layer 20C, and a semiconductor integrated circuit 10 disposed on the solder layer 24.

The resist layer 20C is also disposed on the upper portion of the via 18, as shown in FIGS. 8C and 10.

In addition, shown in FIGS. 8C and 10, the semiconductor integrated circuit device 100 according to the first embodiment may include a metal layer 14 which is disposed on the rear surface of the insulating substrate 12 and faces the metal layer 16 through the insulating substrate 12, and a resist layer 20B disposed on the metal layer 14.

In addition, shown in FIGS. 8C and 10, the semiconductor integrated circuit device 100 according to the first embodiment may include a metal layer 15 which is disposed on an inner wall side surface of the via 18 and connects between the metal layer 16 and the metal layer 14.

The metal layer 16, the metal layer 14 and the metal layer 15 may be made of the same material.

In addition, the semiconductor integrated circuit device 100 may include a resist layer 20T with which the via 18 is filled. In addition, a material with which the via 18 is filled is not limited to the resist layer 20T but may be an insulating layer such as, e.g., epoxy resin or the like.

The resist layer 20C, the resist layer 20B and the resist layer 20T may be made of the same material.

In addition, as shown in FIG. 10, the semiconductor integrated circuit 10 may include an island 6 which can be fused to the solder layer 24, and a semiconductor integrated circuit chip 8 disposed on the island 6.

In addition, as shown in FIG. 10, a plurality of vias 18 may be arranged.

In addition, as shown in FIGS. 6 and 9, the semiconductor integrated circuit device 100 may include terminal electrodes 22 which are arranged on the insulating substrate 12 around the metal layer 16.

The terminal electrodes 22 may be made of the same material as the metal layer 16.

(Manufacturing Method)

As shown in FIGS. 7A to 7C and 8A to 8C, a method for manufacturing the semiconductor integrated circuit device 100 according to the first embodiment includes: a step of preparing an insulating substrate 12 and forming a via 18 in the insulating substrate 12; a step of forming a metal layer 16 on the front surface of the insulating substrate 12, forming a metal layer 14 on the rear surface of the insulating substrate 12 and forming a metal layer 15 on an inner wall side surface of the via 18; a step of forming a resist layer 20 on the metal layer 16, forming a resist layer 20B on the metal layer 14 and forming a resist layer 20T with which the via 18 is filled; a step of forming a resist layer 20C on the metal layer 16 in the vicinity of the via 18 by patterning the resist layer 20; a step of forming a solder layer 24 on the metal layer 16, the resist layer 20C and the via 18; a step of mounting a semiconductor integrated circuit 10 on the solder layer 24; and a step of performing a reflow process to fuse the solder layer 24 and the metal layer 16 and forming a gap region 26G between the solder layer 24 and the resist layer 20C.

The metal layer 16, the metal layer 14 and the metal layer 15 may be formed by a plating process.

A material with which the via 18 is filled is not limited to the resist layer 20T but may be an insulating layer such as, e.g., epoxy resin or the like.

The step of forming a solder layer 24 may include a step of applying a cream solder.

The step of forming a resist layer 20C includes a step of forming the resist layer 20C on the upper portion of the via 18. That is, the step of forming the resist layer 20C may include a step of forming the resist layer 20C on the resist layer 20T.

Hereinafter, the method for manufacturing the semiconductor integrated circuit device 100 according to the first embodiment will be described in more detail with reference to FIGS. 7A to 7C and 8A to 8C.

(a) First, as shown in FIG. 7A, the insulating substrate 12 is prepared and the via 18 is formed.

(b) Next, as shown in FIG. 7A, the metal layer 16 is formed on the front surface of the insulating substrate 12 by the plating process. The metal layer 14 is formed on the rear surface of the insulating substrate 12. The metal layer 15 is formed on the inner wall side surface of the via 18. In the plating process, for example, a seed electrode (Cu) for copper (Cu) plating is formed by a sputtering process. In particular, for the inner wall side surface of the via 18, the seed electrode (Cu) for copper (Cu) plating may be formed by an oblique sputtering process. Thereafter, the metal layers 16, 15 and 14 are formed on the seed electrode by an electrolytic plating process or an electroless plating process. The metal layers 16, 15 and 14 are formed of, for example, a copper foil layer.

(c) Next, as shown in FIG. 7B, the resist layer 20 is formed on the metal layer 16 on the front surface of the insulating substrate 12. Similarly, the resist layer 20B is formed on the metal layer 14 on the rear surface of the insulating substrate 12. Similarly, the resist layer 20T is formed to fill the via 18 penetrating through the insulating substrate 12. The resist layers 20B and 20T may be made of the same material as the resist layer 20. The resist layers may be formed using a printing process. In addition, a material for filling the via 18 is not limited to the resist layer 20T but may be an insulating layer such as, e.g., epoxy resin or the like. In the above description, explanation of steps such as etching not related to the formation of the via 18 of the insulating substrate 12 is omitted.

(d) Next, as shown in FIG. 7C, the resist layer 20 is patterned to form the resist layer 20C as a cap. Here, the cap resist layer 20C is formed over the via 18 in a cap shape and is formed on the resist layer 20T with which the via 18 is filled.

(e) Next, as shown in FIG. 8A, the solder layer 24 is formed on the metal layer 16 and the cap resist layer 20C. Here, the solder layer 24 may be formed, for example, by applying a cream solder.

(f) Next, as shown in FIG. 8B, the semiconductor integrated circuit 10 is mounted on the solder layer 24.

(g) Next, as shown in FIG. 8C, a reflow process is carried out. The reflow process can be carried out, for example, by heat treatment from room temperature to a predetermined temperature within a predetermined time and returning the heat treatment to room temperature again within a predetermined time. Here, the predetermined temperature is, for example, about 240 degrees C. to 260 degrees C. for a lead-free solder (Sn-3Ag-0.5Cu) and about 200 degrees C. to 220 degrees C. for a eutectic solder (Sn-37Pb). After the reflow process, the solder layer 24 is fused only to the metal layer 16 portion. By the reflow process, the cap resist layer 20C obtains a property of repelling the solder layer 24, so that the gap region 26G is formed between the solder layer 24 and the resist layer 20C. The formation of this gap region 26G can prevent a solder flow of the solder layer 24. The formation of the gap region 26G prevents the solder layer 24 from flowing into the via 18, thereby avoiding a short circuit with other parts and hence improving reliability.

(Heat Dissipation Performance)

FIG. 10 serves also to explain the heat dissipation performance of the semiconductor integrated circuit device 100 according to the first embodiment.

As shown in FIG. 10, the solder layer 24 is fused to the metal layer 16 and the gap region 26G is formed between the solder layer 24 and the cap resist layer 20C.

In addition, as shown in FIG. 10, the solder layer 24 is fused to the island 6 on which the semiconductor integrated circuit chip 8 of the semiconductor integrated circuit 10 is mounted. Arrows indicate heat dissipation paths.

In the semiconductor integrated circuit device 100 according to the first embodiment, heat generated from the semiconductor integrated circuit chip 8 conducts to the solder layer 24 via the island 6, as schematically indicated by a heat dissipation path indicated by an arrow in FIG. 10. Further, as well as heat dissipation which conducts through the metal layer 16 in the horizontal direction parallel to the insulating substrate 12, heat dissipation which conducts through the metal layer 14 in the horizontal direction parallel to the insulating substrate 12 is also added by thermal conduction through the via 18 filled with the metal layer 15 and the resist layer 20T.

In the semiconductor integrated circuit device 100 according to the first embodiment, since the via 18 is disposed immediately below the semiconductor integrated circuit chip (die) 8 as a heat source and accordingly there is no further solder suction, excellent heat dissipation performance can be ensured without deterioration of thermal resistance due to a decrease in a solder fusion rate.

[Second Embodiment]

Figure 11:
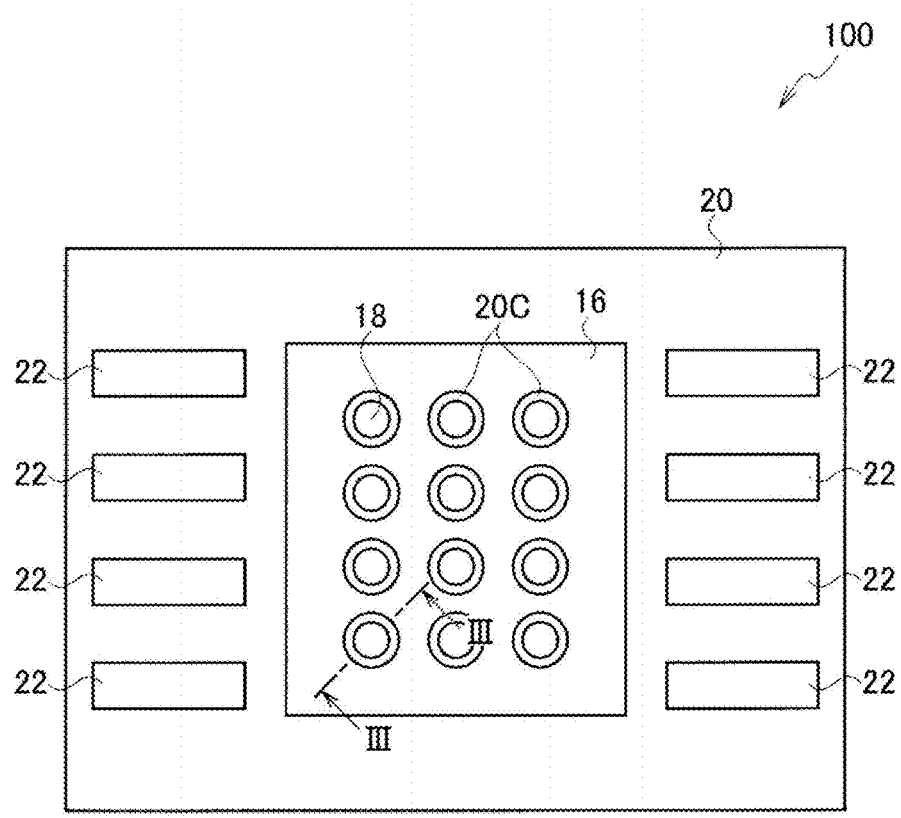
FIG. 11 is a schematic plane pattern structural view before formation of a solder layer in a semiconductor integrated circuit device according to a second embodiment.

FIG. 11 illustrates an example of a schematic plane pattern structure before formation of a solder layer 24 in a semiconductor integrated circuit device 100 according to a second embodiment. The plane pattern structure of FIG. 11 corresponds to a mounting substrate on which a semiconductor integrated circuit 10 is mounted.

Figure 12A:
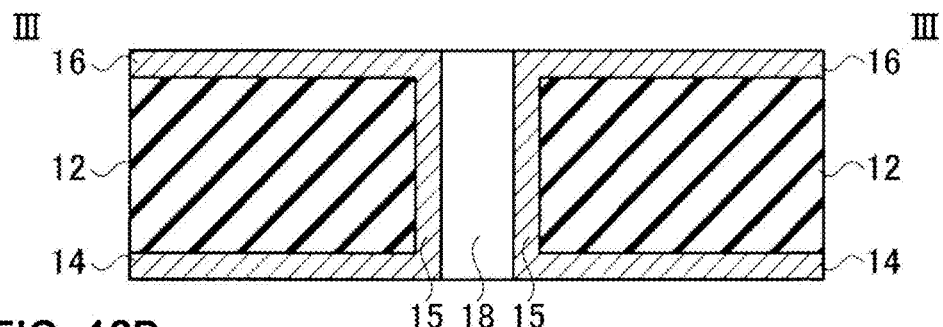
FIG. 12A is a schematic sectional structural view (first view) for explaining a step of a method for manufacturing the semiconductor integrated circuit device according to the second embodiment.
Figure 12B:
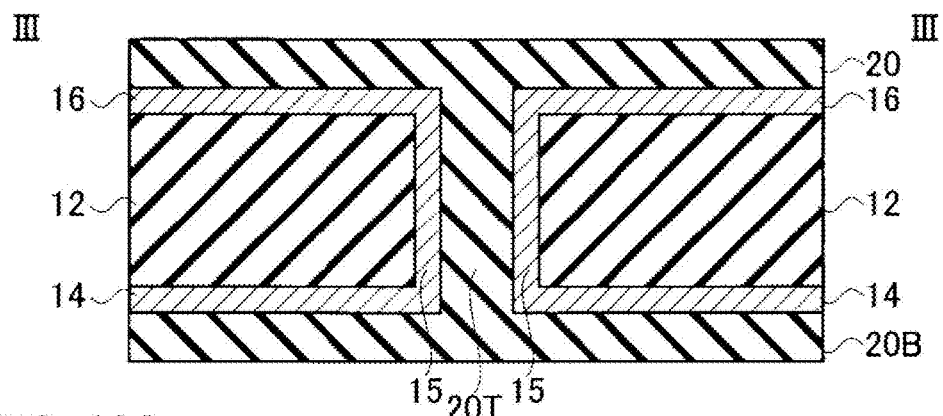
FIG. 12B is a schematic sectional structural view (second view) for explaining a step of the method for manufacturing the semiconductor integrated circuit device according to the second embodiment.
Figure 12C:
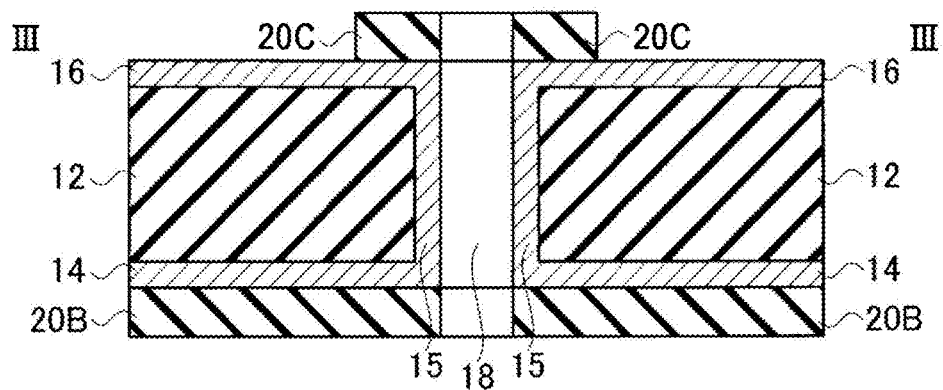
FIG. 12C is a schematic sectional structural view (third view) for explaining a step of the method for manufacturing the semiconductor integrated circuit device according to the second embodiment.

FIG. 12A illustrates a schematic sectional structure (first view) for explaining a step of a method for manufacturing the semiconductor integrated circuit device according to the second embodiment. FIG. 12B illustrates a schematic sectional structure (second view) for explaining a step of the method for manufacturing the semiconductor integrated circuit device according to the second embodiment. FIG. 12C illustrates a schematic sectional structure (third view) for explaining a step of the method for manufacturing the semiconductor integrated circuit device according to the second embodiment. The schematic sectional structures illustrated in FIGS. 12A to 12C correspond to a schematic sectional structure taken along line III-III in FIG. 11. That is, the schematic sectional structures illustrated in FIGS. 12A to 12C correspond to a schematic sectional structure in the vicinity of one via 18.

Figure 13A:
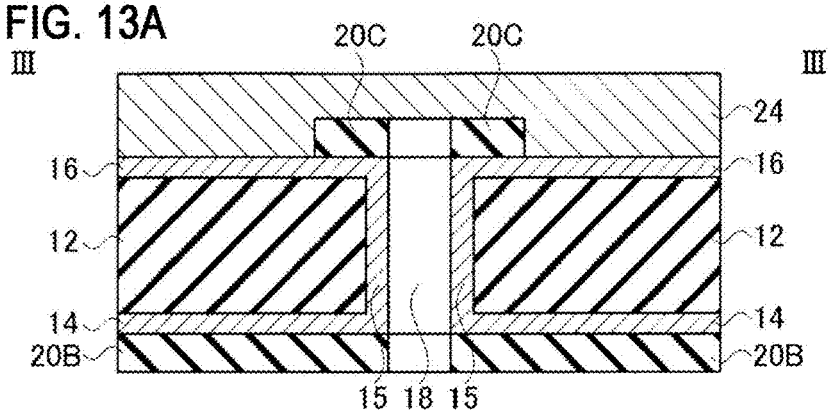
FIG. 13A is a schematic sectional structural view (fourth view) for explaining a step of the method for manufacturing the semiconductor integrated circuit device according to the second embodiment.
Figure 13B:
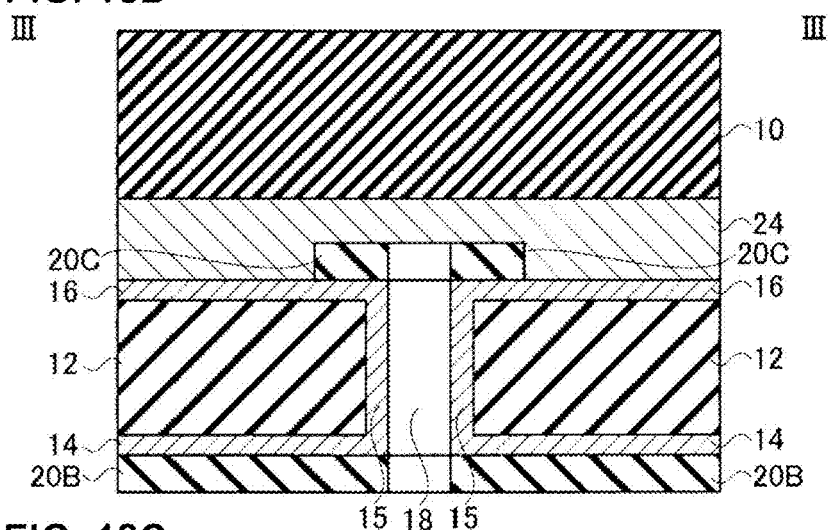
FIG. 13B is a schematic sectional structural view (fifth view) for explaining a step of the method for manufacturing the semiconductor integrated circuit device according to the second embodiment.
Figure 13C:
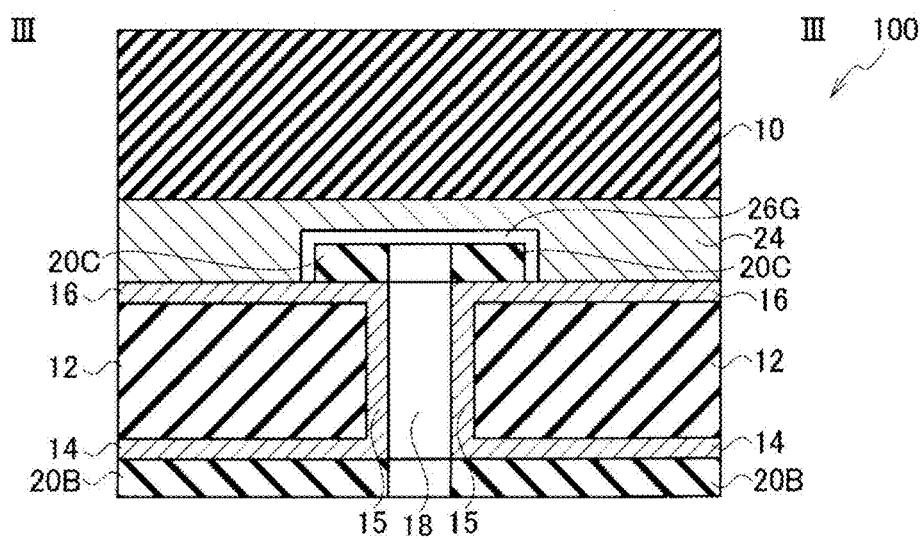
FIG. 13C is a schematic sectional structural view (sixth view) for explaining a step of the method for manufacturing the semiconductor integrated circuit device according to the second embodiment.

In addition, FIG. 13A illustrates a schematic sectional structure (fourth view) for explaining a step of the method for manufacturing the semiconductor integrated circuit device according to the second embodiment. FIG. 13B illustrates a schematic sectional structure (fifth view) for explaining a step of the method for manufacturing the semiconductor integrated circuit device according to the second embodiment. FIG. 13C illustrates a schematic sectional structure (sixth view) for explaining a step of the method for manufacturing the semiconductor integrated circuit device according to the second embodiment. Similarly, the schematic sectional structures illustrated in FIGS. 13A to 13C correspond to a schematic sectional structure taken along line III-III in FIG. 11. That is, the schematic sectional structures illustrated in FIGS. 13A to 13C correspond to a schematic sectional structure in the vicinity of one via 18.

Here, as shown in FIG. 12A, the mounting substrate includes an insulating substrate 12, a metal layer 16 disposed on the insulating substrate 12, and a metal layer 14 disposed on the rear surface of the insulating substrate 12.

A substrate structure including the insulating substrate 12, the metal layer 16 disposed on the front surface of the insulating substrate 12, and the metal layer 14 disposed on the rear surface of the insulating substrate 12 may be formed, for example, by a circuit board structure composed of a joined body including a copper foil layer, an epoxy resin layer and a copper foil layer. For example, a PCB such as CEM3, FR4, FR5 or the like may be applied as the circuit board structure composed of a joined body including a copper foil layer, an epoxy resin layer and a copper foil layer. Alternatively, the substrate structure may be formed by a circuit board composed of a joined body including a metal layer, a ceramic substrate and a metal layer, or an insulating substrate (circuit board) such as a DBC substrate, a DBA substrate, or an AMB substrate.

As shown in FIG. 12A, the insulating substrate 12 has a via 18 with a metal layer 15 disposed on an inner wall side surface of the via 18. A plurality of vias 18 may be present. The via 18, as shown in FIG. 12A, penetrates through the insulating substrate 12, and the metal layer 15 connects between the metal layer 16 and the metal layer 14.

Figure 14:
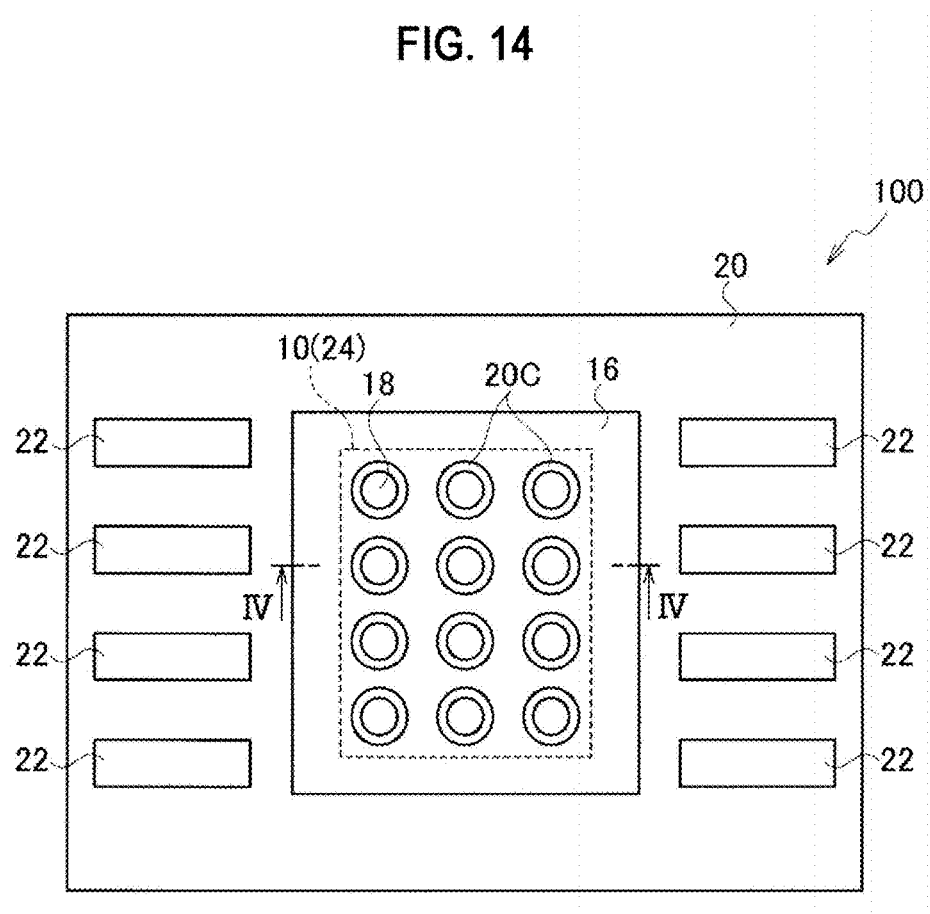
FIG. 14 is a schematic plane pattern structural view after a solder layer is formed and a semiconductor integrated circuit is mounted in the semiconductor integrated circuit device according to the second embodiment.

FIG. 14 illustrates a schematic plane pattern structure after a semiconductor integrated circuit 10 is mounted on the metal layer 16 through a solder layer 24 and a reflow process is performed in the semiconductor integrated circuit device 100 according to the second embodiment. In addition, FIG. 15 illustrates a schematic sectional structure of the semiconductor integrated circuit device 100 according to the second embodiment, which is taken along line IV-IV in FIG. 14.

Figure 15:
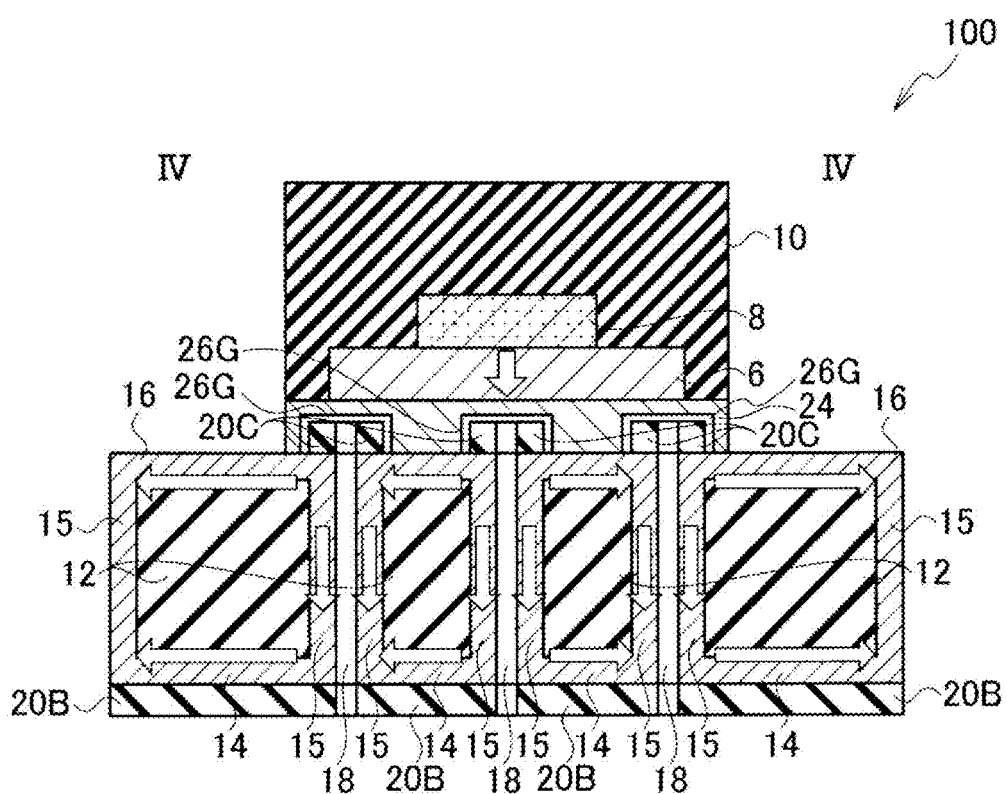
FIG. 15 is a schematic sectional structural view for explaining heat dissipation performance of the semiconductor integrated circuit device according to the second embodiment.

As shown in FIGS. 13C and 15, the semiconductor integrated circuit device 100 according to the second embodiment includes an insulating substrate 12, a via 18 penetrating through the insulating substrate 12, a metal layer 16 disposed on the insulating substrate 12, a resist layer 20C disposed on the metal layer 16 in the vicinity of the via 18, a solder layer 24 disposed on the metal layer 16, the via 18 and the resist layer 20C, a gap region 26G formed between the solder layer 24 and the resist layer 20C, and a semiconductor integrated circuit 10 disposed on the solder layer 24.

Here, the resist layer 20C is not substantially disposed on the via 18.

In addition, the semiconductor integrated circuit device 100 according to the second embodiment may include a metal layer 14 which is disposed on the rear surface of the insulating substrate 12 and faces the metal layer 16 through the insulating substrate 12, and a resist layer 20B disposed on the metal layer 14.

In addition, the semiconductor integrated circuit device 100 according to the second embodiment may include a metal layer 15 which is disposed on an inner wall side surface of the via 18 and connects between the metal layer 16 and the metal layer 14.

The metal layer 16, the metal layer 14 and the metal layer 15 may be made of the same material.

The resist layer 20C and the resist layer 20B may be made of the same material.

In addition, as shown in FIG. 15, the semiconductor integrated circuit 10 may include an island 6 which can be fused to the solder layer 24, and a semiconductor integrated circuit chip 8 disposed on the island 6.

In addition, a plurality of vias 18 may be included.

In addition, as shown in FIGS. 11 and 14, the semiconductor integrated circuit device 100 may include terminal electrodes 22 which are arranged on the insulating substrate 12 around the metal layer 16.

The terminal electrodes 22 may be made of the same material as the metal layer 16.

(Manufacturing Method)

As shown in FIGS. 12A to 12C and 13A to 13C, a method for manufacturing the semiconductor integrated circuit device 100 according to the second embodiment includes: a step of preparing an insulating substrate 12 and forming a via 18 in the insulating substrate 12; a step of forming a metal layer 16 on the front surface of the insulating substrate 12, forming a metal layer 14 on the rear surface of the insulating substrate 12 and forming a metal layer 15 on an inner wall side surface of the via 18; a step of forming a resist layer 20 on the metal layer 16, forming a resist layer 20B on the metal layer 14 and forming a resist layer 20T with which the via 18 is filled; a step of forming a resist layer 20C on the metal layer 16 in the vicinity of the via 18 by patterning the resist layers 20, 20B and 20T to penetrate the via 18; a step of forming a solder layer 24 on the metal layer 16, the resist layer 20C and the via 18; a step of mounting a semiconductor integrated circuit 10 on the solder layer 24; and a step of performing a reflow process to fuse the solder layer 24 and the metal layer 16 and forming a gap region 26G between the solder layer 24 and the resist layer 20C.

The resist layer 20C is formed on the upper portion of the metal layer 15 disposed on the inner wall side surface of the via 18, while the resist layer 20C is not formed on the upper portion of the hollow via 18.

The metal layer 16, the metal layer 14 and the metal layer 15 may be formed by a plating process.

The step of forming a solder layer 24 may include a step of applying a cream solder.

Hereinafter, the method for manufacturing the semiconductor integrated circuit device 100 according to the second embodiment will be described in more detail with reference to FIGS. 12A to 12C and 13A to 13C.

(a) First, as shown in FIG. 12A, the insulating substrate 12 is prepared and the via 18 is formed.

(b) Next, as shown in FIG. 12A, the metal layer 16 is formed on the front surface of the insulating substrate 12 by the plating process. The metal layer 14 is formed on the rear surface of the insulating substrate 12. The metal layer 15 is formed on the inner wall side surface of the via 18. In the plating process, for example, a seed electrode (Cu) for copper (Cu) plating is formed by a sputtering process. For the inner wall side surface of the via 18, the seed electrode (Cu) for copper (Cu) plating may be formed by an oblique sputtering process. Thereafter, the metal layers 16, 15 and 14 are formed on the seed electrode by an electrolytic plating process or an electroless plating process. The metal layers 16, 15 and 14 are formed of, for example, a copper foil layer.

(c) Next, as shown in FIG. 12B, the resist layer 20 is formed on the metal layer 16 on the front surface of the insulating substrate 12. Similarly, the resist layer 20B is formed on the metal layer 14 on the rear surface of the insulating substrate 12. Similarly, the resist layer 20T is formed to fill the via 18 penetrating through the insulating substrate 12. The resist layers 20B and 20T may be made of the same material as the resist layer 20. The resist layers may be formed using a printing process. In the above description, explanation of steps such as etching not related to the formation of the via 18 of the insulating substrate 12 is omitted.

(d) Next, as shown in FIG. 12C, the resist layers 20, 20B and 20T are patterned so as to penetrate through the via 18 to form the resist layer 20C as a cap. Here, the cap resist layer 20C is formed on the metal layer 16 in the vicinity of the via 18.

(e) Next, as shown in FIG. 13A, the solder layer 24 is formed on the metal layer 16, the cap resist layer 20C and the via 18. Here, the solder layer 24 may be formed, for example, by applying a cream solder.

(f) Next, as shown in FIG. 13B, the semiconductor integrated circuit 10 is mounted on the solder layer 24.

(g) Next, as shown in FIG. 13C, a reflow process is carried out. The reflow process can be carried out, for example, by heat treatment from room temperature to about 450 degrees C. within a predetermined time and returning the heat treatment to room temperature again within a predetermined time. Here, after the reflow process, the solder layer 24 is fused only to the metal layer 16 portion. By the reflow process, the cap resist layer 20C obtains a property of repelling the solder layer 24, so that the gap region 260 is formed between the solder layer 24 and the resist layer 20C. The formation of this gap region 26G can prevent a solder flow of the solder layer 24. The formation of the gap region 26G prevents the solder layer 24 from flowing into the via 18, thereby avoiding a short circuit with other parts and hence improving reliability.

(Heat Dissipation Performance)

FIG. 15 serves also to explain the heat dissipation performance of the semiconductor integrated circuit device 100 according to the second embodiment.

As shown in FIG. 15, the solder layer 24 is fused to the metal layer 16 and the gap region 26G is formed between the solder layer 24 and the cap resist layer 20C.

In addition, as shown in FIG. 15, the solder layer 24 is fused to the island 6 on which the semiconductor integrated circuit chip 8 of the semiconductor integrated circuit 10 is mounted. Arrows indicate heat dissipation paths.

In the semiconductor integrated circuit device 100 according to the second embodiment, heat generated from the semiconductor integrated circuit chip 8 conducts to the solder layer 24 via the island 6, as schematically indicated by a heat dissipation path indicated by an arrow in FIG. 15. Further, as well as heat dissipation which conducts through the metal layer 16 in the horizontal direction parallel to the insulating substrate 12, heat dissipation which conducts through the metal layer 14 in the horizontal direction parallel to the insulating substrate 12 is also added by thermal conduction through the metal layer 15.

In the semiconductor integrated circuit device 100 according to the second embodiment, since the via 18 is disposed immediately below the semiconductor integrated circuit chip (die) 8 as a heat source and accordingly there is no further solder suction, excellent heat dissipation performance can be ensured without deterioration of thermal resistance due to a decrease in the solder fusion rate.

(Temperature Distribution Simulation)

With the miniaturization of semiconductor integrated circuit components, the ambient temperature Ta of the device has been greatly influenced by the arrangement of various heat generating components on a mounting substrate. In addition, with high density packaging on a mounting substrate, situations where thermal interference occurs between adjacent semiconductor integrated circuit components have also occurred. Therefore, for example, it is necessary analyze the application of CFD (Computational Fluid Dynamics), and the necessity of a thermal resistance model required for analysis is increasing.

In order to predict the temperature of each part of the semiconductor integrated circuit including the junction temperature with high accuracy, an accurate model of an internal structure thereof is required. For example, as an analysis tool, a highly accurate model considering the internal structure of the semiconductor integrated circuit has been proposed and adopted by JEDEC (Joint Electron Device Engineering Councils) of the standardization organization.

Figure 16A:
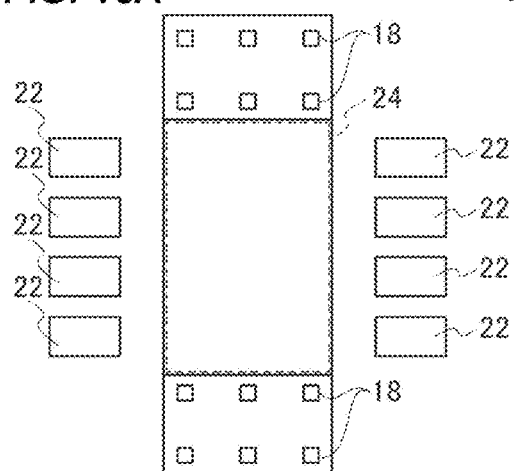
FIG. 16A is a schematic plane pattern structural view of a semiconductor integrated circuit device according to a comparative example applied to a temperature distribution simulation using a thermal resistance analysis model.
Figure 16B:
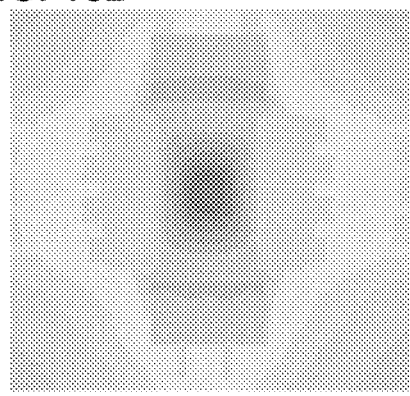
FIG. 16B shows a simulation result of the temperature distribution in the surface of the semiconductor integrated circuit device of FIG. 16A.
Figure 16C:
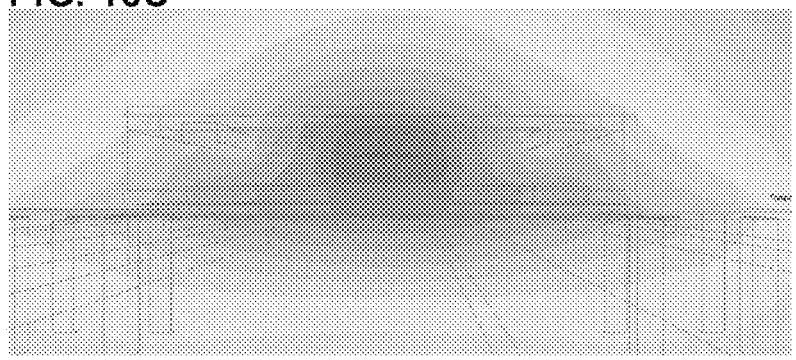
FIG. 16C shows a simulation result of the temperature distribution in the cross section of the semiconductor integrated circuit device of FIG. 16A.
Figure 16D:
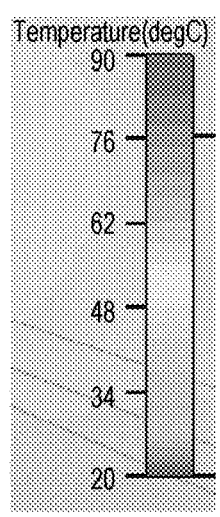
FIG. 16D is a temperature distribution diagram of the applied temperature distribution simulation.

FIG. 16A illustrates a schematic plane pattern structure of a semiconductor integrated circuit device according to a comparative example applied to a temperature distribution simulation using a thermal resistance analysis model. FIG. 16B shows a simulation result of the temperature distribution on the surface in the semiconductor integrated circuit device and FIG. 16C shows a simulation result of the temperature distribution in the cross section of the semiconductor integrated circuit device. FIG. 16D shows a temperature distribution diagram of the applied temperature distribution simulation.

In the semiconductor integrated circuit device according to the comparative example, as shown in FIG. 16A, the via 18 is not disposed immediately below the solder layer 24. Therefore, the maximum junction temperature Tj of the semiconductor integrated circuit device reached about 83.2 degrees C. and the thermal resistance θJA between the junction and the surrounding was about 41.9 degrees C./W.

Figure 17A:
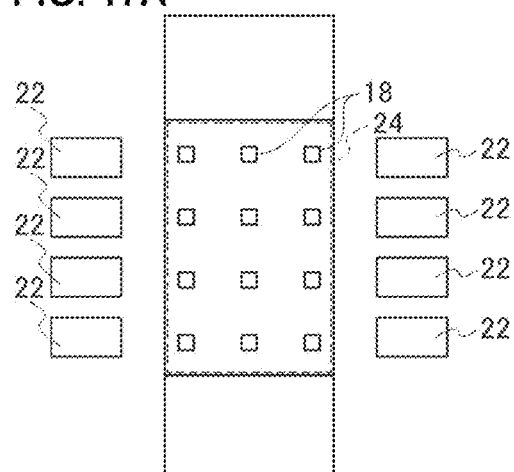
FIG. 17A is a schematic plane pattern structural view of a semiconductor integrated circuit device according to the first embodiment applied to a temperature distribution simulation using a thermal resistance analysis model.
Figure 17B:
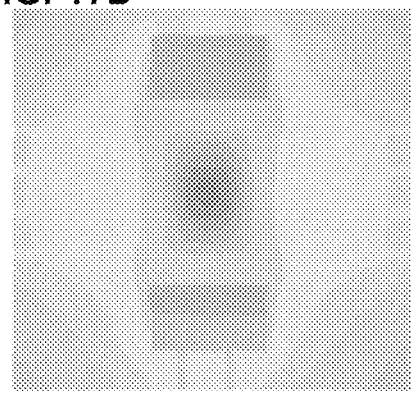
FIG. 17B shows a simulation result of the temperature distribution in the surface of the semiconductor integrated circuit device of FIG. 17A.
Figure 17C:
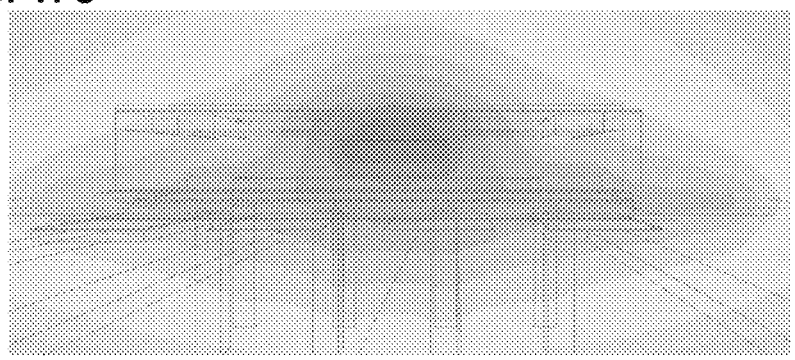
FIG. 17C shows a simulation result of the temperature distribution in the cross section of the semiconductor integrated circuit device of FIG. 17A.
Figure 17D:
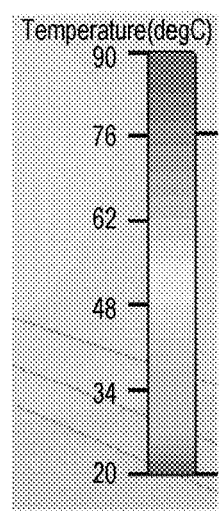
FIG. 17D is a temperature distribution diagram of the applied temperature distribution simulation.

FIG. 17A illustrates a schematic plane pattern structure of a semiconductor integrated circuit device according to the first embodiment applied to a temperature distribution simulation using a thermal resistance analysis model. FIG. 17B shows a simulation result of the temperature distribution in the surface of the semiconductor integrated circuit device and FIG. 17C shows a simulation result of the temperature distribution in the cross section of the semiconductor integrated circuit device. FIG. 17D shows a temperature distribution diagram of the applied temperature distribution simulation.

In the semiconductor integrated circuit device according to the first embodiment, as shown in FIG. 17A, the via 18 is disposed immediately below the solder layer 24. In addition, in the example used for the simulation, calculation was performed assuming that the via 18 is filled with epoxy resin (thermal conductivity: 0.3 W/mK).

Therefore, the maximum junction temperature Tj of the semiconductor integrated circuit device according to the first embodiment dropped to about 76.3 degrees C. and the thermal resistance θJA between the junction and the surrounding was also lowered to about 37.3 degrees C./W.

Figure 18A:
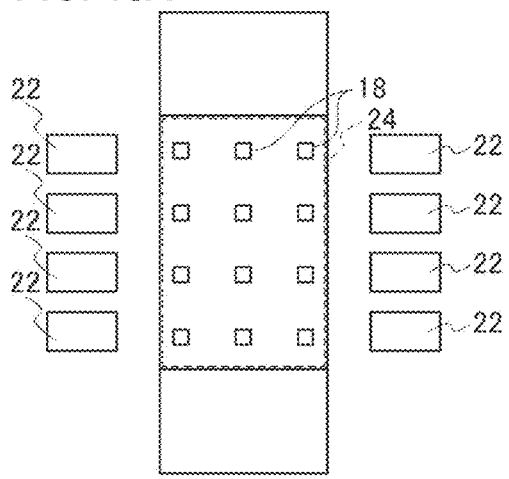
FIG. 18A is a schematic plane pattern structural view of a semiconductor integrated circuit device according to the second embodiment applied to a temperature distribution simulation using a thermal resistance analysis model.
Figure 18B:
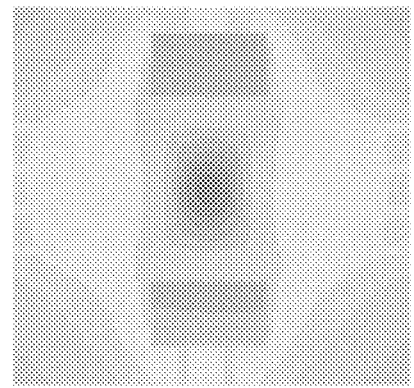
FIG. 18B shows a simulation result of the temperature distribution in the surface of the semiconductor integrated circuit device of FIG. 18A.
Figure 18C:
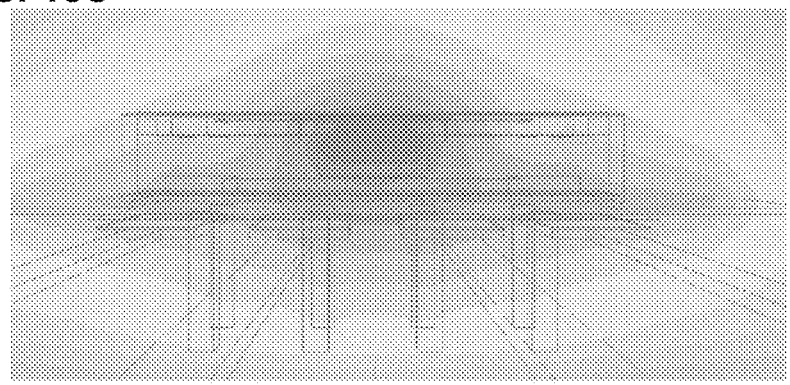
FIG. 18C shows a simulation result of the temperature distribution in the cross section of the semiconductor integrated circuit device of FIG. 18A.
Figure 18D:
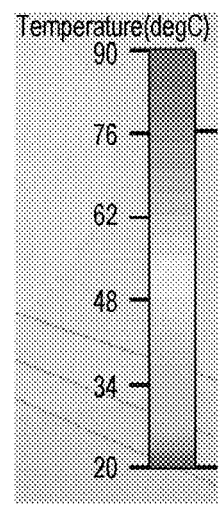
FIG. 18D is a temperature distribution diagram of the applied temperature distribution simulation.

FIG. 18A illustrates a schematic plane pattern structure of a semiconductor integrated circuit device according to the second embodiment applied to a temperature distribution simulation using a thermal resistance analysis model. FIG. 18B shows a simulation result of the temperature distribution in the surface of the semiconductor integrated circuit device and FIG. 18C shows a simulation result of the temperature distribution in the cross section of the semiconductor integrated circuit device. FIG. 18D shows a temperature distribution diagram of the applied temperature distribution simulation.

In the semiconductor integrated circuit device according to the second embodiment, as shown in FIG. 18A, the via 18 is disposed immediately below the solder layer 24. In addition, in the example used for the simulation, the via 18 is not filled with a resist layer or epoxy resin.

Therefore, the maximum junction temperature Tj of the semiconductor integrated circuit device according to the second embodiment is about 76.4 degrees C. and the thermal resistance θJA between the junction and the surrounding is about 37.4 degrees C./W, which are slightly higher than those of the semiconductor integrated circuit device according to the first embodiment. In the semiconductor integrated circuit device according to the first embodiment, since the via 18 is filled with epoxy resin (thermal conductivity: 0.3 W/mK), the heat dissipation property is slightly improved over a case of air (thermal conductivity: 0.04 W/mK).

In the above description, the solder layer 24 can be formed of, e.g., a lead-free solder (Sn-3Ag-0.5Cu), a eutectic solder (Sn-37Pb) or the like.

In addition, Au flash layer deposition, solder plating, Au plating or the like may be performed on the metal layers 16, 14 and 15 and the terminal electrodes 22, which are formed of a copper (Cu) foil layer, to form a layered structure of Au/Cu.

In addition, a fin package, a TO-252 type package, a TO-263 thin type package, a package having a heat dissipation plate such as ExposedPAD and Fin, or the like may be applied as a package on which the semiconductor integrated circuit device according to the embodiment is mounted.

In addition to the semiconductor integrated circuit chip mounted on the semiconductor integrated circuit device according to the embodiment, for example, a field effect transistor (FET), a diode, a three-terminal regulator or the like can be mounted on the semiconductor integrated circuit device.

As described above, according to the present embodiment, it is possible to provide a semiconductor integrated circuit device with improved heat dissipation performance and a method of manufacturing the same.

(Other Embodiments)

As described above, the present disclosure has been illustrated by way of some embodiments, but the description and drawings which constitute a part of this disclosure are exemplary and should not be construed to limit the present disclosure. Various alternative embodiments, examples and operation techniques will be apparent to those skilled in the art from this disclosure.

Thus, the present disclosure includes other different embodiments which are not described herein.

INDUSTRIAL APPLICABILITY

The semiconductor integrated circuit device of the present embodiments can be applied to a wide range of fields including mobile devices, in-vehicle devices, industrial devices, medical devices, display devices, etc.

According to the present disclosure in some embodiments, it is possible to provide a semiconductor integrated circuit device with improved heat dissipation performance, and a method for manufacturing the same.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit device comprising:
an insulating substrate;
a via which penetrates through the insulating substrate;
a first metal layer disposed on a front surface of the insulating substrate;
a first resist layer disposed on the first metal layer in the vicinity of the via;
a solder layer disposed on the first metal layer, the via and the first resist layer;
a gap region formed between the solder layer and the first resist layer; and
a semiconductor integrated circuit, including an island and a semiconductor integrated circuit chip, disposed on the solder layer,
wherein the island is fused to the solder layer and the semiconductor integrated circuit chip is disposed on the island.

2. The semiconductor integrated circuit device of claim 1, wherein the first resist layer is disposed on the via.

3. A semiconductor integrated circuit device comprising:
an insulating substrate;
a via which penetrates through the insulating substrate;
a first metal layer disposed on a front surface of the insulating substrate;
a first resist layer disposed on the first metal layer in the vicinity of the via;
a solder layer disposed on the first metal layer, the via and the first resist layer;
a gap region formed between the solder layer and the first resist layer;
a semiconductor integrated circuit disposed on the solder layer;
a second metal layer which is disposed on a rear surface of the insulating substrate and faces the first metal layer through the insulating substrate; and
a second resist layer disposed on the second metal layer.

4. The semiconductor integrated circuit device of claim 3, further comprising:
a third metal layer which is disposed on an inner wall side surface of the via and is connected with the first metal layer and the second metal layer.

5. The semiconductor integrated circuit device of claim 4, wherein the first metal layer, the second metal layer and the third metal layer are made of the same material.

6. The semiconductor integrated circuit device of claim 3, further comprising: an insulating layer with which the via is filled.

7. The semiconductor integrated circuit device of claim 6, wherein the insulating layer includes a third resist layer.

8. The semiconductor integrated circuit device of claim 6, wherein the insulating layer includes epoxy resin.

9. The semiconductor integrated circuit device of claim 7, wherein the first resist layer, the second resist layer and the third resist layer are made of the same material.

10. The semiconductor integrated circuit device of claim 1, wherein a plurality of vias are provided.

11. A semiconductor integrated circuit device comprising:
an insulating substrate;
a via which penetrates through the insulating substrate;
a first metal layer disposed on a front surface of the insulating substrate;
a first resist layer disposed on the first metal layer in the vicinity of the via;
a solder layer disposed on the first metal layer, the via and the first resist layer;
a gap region formed between the solder layer and the first resist layer,
a semiconductor integrated circuit disposed on the solder layer; and
one or more terminal electrodes which are disposed on the insulating substrate around the first metal layer.

12. The semiconductor integrated circuit device of claim 11, wherein the one or more terminal electrodes are made of the same material as the first metal layer.

* * * * *